United States Patent [19]

Amemiya

[11] Patent Number: 4,935,947
[45] Date of Patent: Jun. 19, 1990

[54] X-RAY EXPOSURE APPARATUS

[75] Inventor: Mitsuaki Amemiya, Atsugi, Japan

[73] Assignee: Canon Kabushiki Kaisha, Tokyo, Japan

[21] Appl. No.: 309,918

[22] Filed: Feb. 7, 1989

Related U.S. Application Data

[62] Division of Ser. No. 33,774, Apr. 3, 1987, abandoned.

[30] Foreign Application Priority Data

| Apr. 10, 1986 | [JP] | Japan | 61-81190 |
| Apr. 17, 1986 | [JP] | Japan | 61-87212 |
| Jan. 6, 1987 | [JP] | Japan | 62-226 |
| Jan. 6, 1987 | [JP] | Japan | 62-227 |
| Mar. 27, 1987 | [JP] | Japan | 62-71709 |
| Mar. 27, 1987 | [JP] | Japan | 62-71710 |

[51] Int. Cl.$^5$ ............................................. H05H 1/24
[52] U.S. Cl. .................................. 378/119; 378/120; 378/121
[58] Field of Search ............... 378/119, 120, 121; 376/144, 145, 150

[56] References Cited

U.S. PATENT DOCUMENTS

| 4,385,434 | 5/1983 | Zehnpfennig et al. | 378/34 |
| 4,514,858 | 4/1985 | Novak | 378/34 |
| 4,604,345 | 8/1986 | Amemiya | . |

FOREIGN PATENT DOCUMENTS

| 3507340 | 9/1985 | Fed. Rep. of Germany | . |
| 188040 | 11/1983 | Japan | . |

OTHER PUBLICATIONS

A. Zacharias, "X-Ray Lithography Exposure Machines," Solid State Technology, Aug. 1981, pp. 57-59.
D. L. Spears et al., "X-Ray Lithography—A New High Resolution Replication Process," Solid State Technology, Jul. 1972, pp. 21-26.

Primary Examiner—Carolyn E. Fields
Assistant Examiner—David P. Porta
Attorney, Agent, or Firm—Fitzpatrick, Cella, Harper & Scinto

[57] ABSTRACT

A device for generating X-rays is disclosed, which includes a portion for producing plasma in a predetermined space, for generation of the X-rays, and a wall uni effective to define a surface substantially surrounding the space, the wall unit including a portion which is made of a dielectric material and which is made movable so as to compensate for consumption of the dielectric material due to the production of the plasma by the plasma producing portion. Also, an X-ray exposure apparatus usable with a mask having a pattern and a wafer, for transferring the pattern of the mask onto the wafer, is disclosed. The apparatus includes an X-ray source for producing X-rays, an exposure system for exposing the mask and the wafer under an exposure condition, the exposing system including a holder for holding the mask and the wafer so that the mask is exposed to the X-rays from the X-ray source and so that the wafer is exposed to the X-rays passed through the mask, such that the pattern of the mask is transferred onto the wafer, and a control system for controlling the exposure condition so that the pattern transferred onto the wafer has a desired width of line.

14 Claims, 17 Drawing Sheets

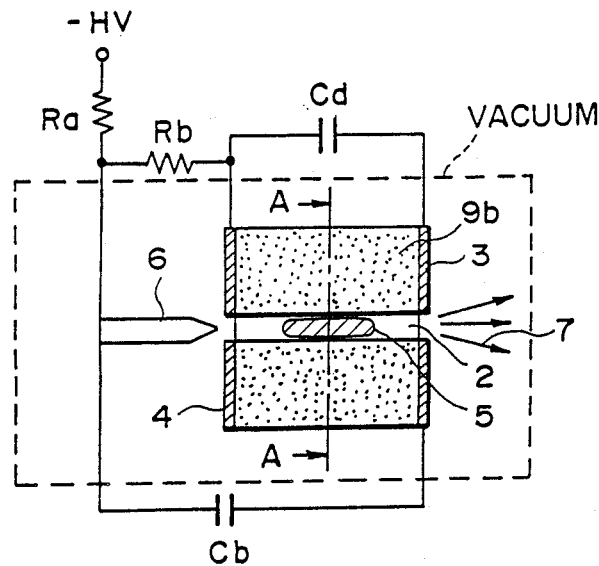
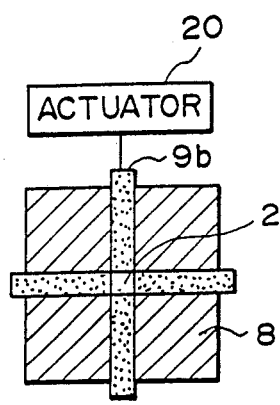
F I G. 6A    F I G. 6B
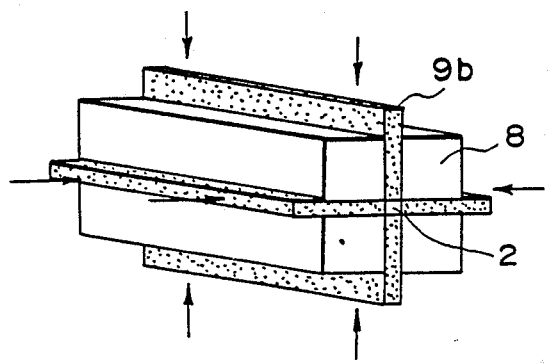
F I G. 7

X-RAY EXPOSURE APPARATUS

This application is a division of application Ser. No. 033,774 filed Apr. 3, 1987 now abandoned.

FIELD OF THE INVENTION AND RELATED ART

This invention relates to an X-ray exposure apparatus for use in the manufacture of semiconductor devices such as large scaled integrated circuits (LSIs), and very large scaled integrated circuits (VLSIs), etc. More particularly, the invention is concerned with an X-ray exposure apparatus of the "proximity exposure" type for patterningly exposing a workpiece such as a semiconductor wafer with psuedo-parallel or approximately parallel X-rays.

In order to meet recent requirements of further miniaturization of semiconductor devices, X-ray exposure apparatuses using X-rays, in place of light, have been proposed to transfer a mask pattern onto a resist material (photoresist material) applied to a semiconductor wafer. For such X-ray exposure apparatuses, there have been proposed two types, one is a type in which diverging X-rays are used while the other is a type in which approximately parallel X-rays are used. Basically, both of these types of exposure apparatuses are of the "proximity" type in which the mask pattern is transferred onto the resist material at a one-to-one magnification, with a minute gap being maintained between the mask and the wafer.

However, due to the limited kinds of sources usable as X-ray sources or due to the difficulty in making the X-rays completely parallel, the X-ray exposure apparatuses which are of the proximity exposure type involve an inherent problem of penumbral shadow that appears at an edge portion of the pattern just being transferred onto the resist material on the wafer. The occurrence of such penumbral shadow often results in incoincidence of the width of line of a resist pattern, formed on the wafer after a developing process, with the width of line of the mask pattern.

For an X-ray source, an X-ray generating device which utilizes the phenomenon of creeping discharge has been proposed. This type of X-ray generating device is effective to produce high-power X-rays, as compared with traditional type X-ray generating devices in which X-rays are produced by projecting high-speed electron beams upon a target. FIGS. 1A and 1B show a basic structure of such X-ray generator utilizing the creeping discharge.

As shown in FIGS. 1A and 1B, the generator includes an insulator 1 of cylindrical shape, made of polyethylene and having a throughbore 2 called "capillary", a capillary space, that extends through the center of the insulator 1. Disposed on the opposite sides of the insulator 1 are electrodes 3 and 4. The generator further includes resistors Ra and Rb and capacitors Cb and Cd. High-power DC electric voltage −HV is applied to an end of the resistor Ra.

When, in such structure, the capacitor Cd is charged and a sufficiently high electric voltage is applied to the insulator 1, a portion of the polyethylene material, constituting the insulator 1, is vaporized as a result of the creeping discharge in the capillary 2, such that plasma 5 is produced. At this time, electron beams are projected upon the plasma 5 by use of a cathode 6. In response, the temperature of the plasma 5 and the density thereof are increased, with the result that X-rays 7 are generated.

According to the arrangement of the X-ray generator described above, the polyethylene material constituting the insulator 1 is consumed with the repetition of the creeping discharge, with the result that the diameter of the capillary 2 increases gradually. It has been confirmed that, for a capillary originally having a diameter of approx. 1 mm, about three hundreds times of repeated electric discharging operations with the application of approx. 50 KV voltage have enlarged the capillary diameter to approx. 3 mm. The enlargement of the capillary diameter leads to a decrease in the plasma density, which results in a decrease in the intensity of X-rays produced. For this reason, the X-ray generator of the type described has a relatively short life time.

Further, the wavelength of X-rays to be produced is determined by an element or elements of the material used for the insulator. Almost all the currently developed X-ray generators are arranged to produce long-wavelength X-rays such as $K\alpha$-rays for carbon. With the conventional technique, it is not easy to produce short-wavelength X-rays having a wavelength shorter than 10 Angstrom.

SUMMARY OF THE INVENTION

It is accordingly a primary object of the present invention to provide an X-ray exposure apparatus of proximity type using approximately parallel X-rays, wherein exposure conditions can be so controlled that the final line width of a resist pattern is precisely controlled as desired.

It is another object of the present invention to provide an X-ray exposure apparatus wherein optimum exposure conditions, for particular conditions such as a desired line width of a resist pattern, the property of a mask used, the characteristics of a resist material used, etc., are determined and the exposure operation is controlled automatically in accordance with the determined exposure conditions.

It is a further object of the present 5 invention to provide a high-power X-ray generating device capable of producing high-intensity X-rays for long period of time.

It is a still further object of the present invention to provide a high-power X-ray generating device which is capable of producing high-intensity X-rays for a long period of time and which is capable of producing short-wavelength X-rays whose wavelength is shorter than 10 Angstrom.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic and diagrammatic view of a control system for controlling drive of dielectric sheets, in the X-ray generating device of the FIG. 2A embodiment.

FIG. 5A is a fragmentary and perspective view of an X-ray generating portion of the device of the FIG. 4A embodiment.

FIG. 5B is a fragmentary view showing inner surfaces of dielectric sheets of FIG. 5A.

FIG. 6A is a vertical section schematically showing an X-ray generating device according to a further embodiment of the present invention.

FIG. 6B is a cross-sectional view, taken on a dash-and-dot line in FIG. 6A and as viewed in the direction of arrows A.

FIG. 7 is a perspective view of an X-ray generating portion of the device of the FIG. 6A embodiment.

FIGS. 9-11 are cross-sectional views, respectively, showing modified forms of X-ray generating portions.

FIG. 12 is a view similar to FIG. 5B but showing another example of dielectric sheets used in the X-ray generating device.

FIG. 13 is a cross-sectional view showing a modified form of X-ray generating portion.

FIG. 14A is a vertical section schematically showing an X-ray generating device according to a yet another embodiment of the present invention.

FIG. 14B is a perspective view of an X-ray generating portion of the FIG. 14A embodiment.

FIG. 19 is a schematic and diagrammatic view of an X-ray exposure apparatus according to another aspect of the present invention.

DESCRIPTION OF THE PREFERRED EMBODIMENTS

Figure 1B:
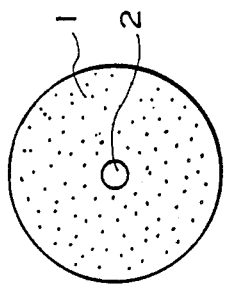
FIG. 1B is a cross section taken on a dash-and-dot line in FIG. 1A and as viewed in the direction of arrows A.
Figure 1A:
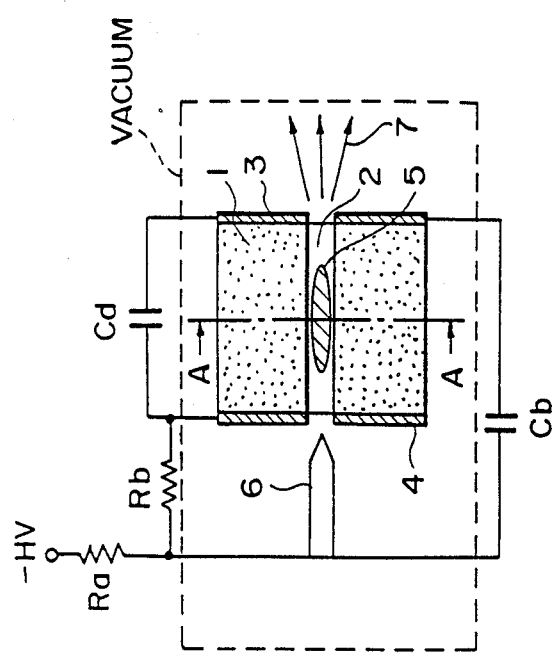
FIG. 1A is a vertical section schematically showing a known type X-ray generator.
Figures 2A, 2B:
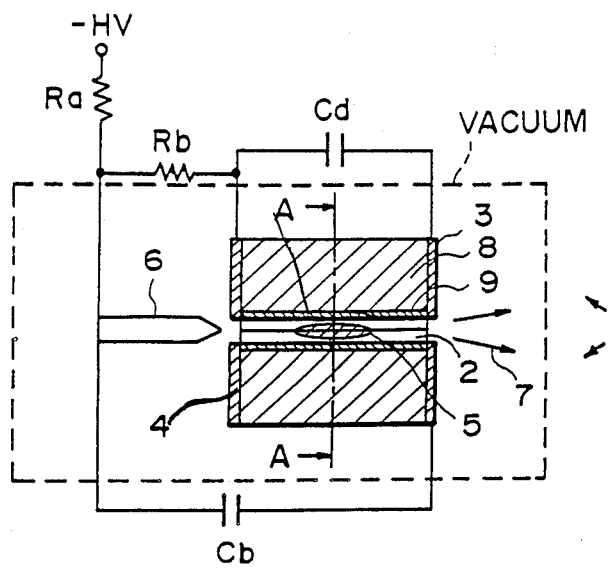
FIG. 2A is a vertical section schematically showing an X-ray generating device according to one embodiment of the present invention.
FIG. 2B is a cross-sectional view, taken on a dash-and-dot line in FIG. 2A and as viewed in the direction of arrows A.
Figure 2C:
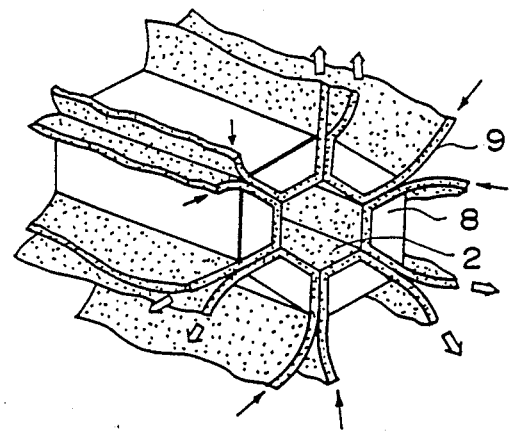
FIG. 2C is a fragmentary and perspective view of an X-ray generating portion of the device of the FIG. 2A embodiment.

Referring now to FIGS. 2A-2C, there is shown an X-ray generating device according to an embodiment of the present invention.

As illustrated in these Figures, the X-ray generating device of the present embodiment includes resistors Ra and Rb, capacitors Cb and Cd, and a cathode 6. To an end of the resistor Ra, a high-power DC electric voltage $-HV$ is supplied from a power source VS (FIG. 3). The device further includes insulator means which comprises a plurality of elongated insulator segments 8 each having a trapezoidal or triangular shape in cross section. In this embodiment, the insulator means is provided by six insulator segments 8. Electrodes 3 and 4 each having a central opening of hexagonal shape are attached to the opposite sides of the insulator means. More particularly, the insulator segments 8 are detachably fixed to the electrodes 3 and 4 in the manner that the insulator segments 8 cooperate with each other to define a capillary 2. Also, the insulator segments 8 are so held that a clearance is defined between opposed surfaces of two adjacent insulator segments. In this embodiment, as seen from FIG. 2B, six clearances are defined by the six insulator segments. As best seen in FIGS. 2B and 2C, the X-ray generating device of the present embodiment uses six sheet-like members 9 each made of a dielectric material. Each dielectric sheet 9 extends around corresponding one of the insulator segments 8 in the manner as illustrated in FIGS. 2B and 2C. That is, each of the six clearances of the six insulator segments 8 is defined so as to receive two of the dielectric sheets 9. Each dielectric sheet 9 is made slidable along the surface of corresponding one of the insulator segments 8, as depicted by arrows in FIGS. 2B and 2C. This will be described later in more detail with reference to FIG. 3.

It will be understood from FIGS. 2A-2C that the capillary 2 is defined by the cooperative arrangement of the six insulator segments 8 and portions of the six dielectric sheets 9. More specifically, the capillary 2 is encircled by the portions of the dielectric sheets 9. Each dielectric sheet 9 is made of an electrically insulative material that contains an element or elements adapted for emission of X-rays of a desired wavelength range. For example, where emission of X-rays of carbon is desired, the sheet 9 may be made of polyethylene. Each dielectric sheet 9 has a thickness of an order of 1-100 microns. Each insulator segment 8 may be made of the same material as the dielectric sheet 9 or, alternatively, it may be made of a different electrically insulative material such as, for example, aluminum oxide $Al_2O_3$. The electrode 3 and 4, the cathode 6, the insulator segments 8 and the dielectric sheets 9 are contained in a vacuum chamber.

Referring now to FIG. 3, description will be made to a drive controlling system for controllably feeding the dielectric sheets 9.

The system includes sheet driving units 8a each comprising two take-up rollers RL. For feeding, an end of each of the dielectric sheets 9 is attached to corresponding one of the take-up rollers RL, and each roller RL is rotated by means of corresponding one of driving motors MT. By this, each dielectric sheet 9 is wound around the corresponding roller RL, so that it is pulled and fed along the surface of corresponding one of the insulator segments 8, in the direction as depicted by arrows in FIGS. 2B and 2C. At the opposite end side of each dielectric sheet 9, a sheet supply roller (not shown) is provided. The supply roller has a necessary amount of dielectric sheet wound thereon and supplies the sheet by an amount as fed by the take-up roller RL. The driving motors MT are actuated by motor drivers MD, respectively, under the control of a central processing unit 117 (hereinafter "CPU"). Accordingly, the six dielectric sheets 9 are fed by means of the six take-up rollers RL, the six motors MT and the six motor drivers MD in response to instruction signals supplied from the CPU 117.

Referring back to FIGS. 2A–2C, the X-ray generating operation will now be described.

When the capacitor Cd is charged and a sufficiently high electric voltage is applied to each of the insulator segments 8, the surface portions of the dielectric sheets 9 are vaporized due to the creeping discharge in the capillary 2, with the result that plasma 5 is produced as schematically illustrated in FIG. 2A. At this time, from the cathode 6, electron beams are projected upon the plasma 5. In response, the temperature of the plasma 5 as well as the density thereof are increased. As a result, X-rays are generated as depicted at 7 in FIG. 2A.

Due to the creeping discharge, a portion of the material of the surface of each dielectric sheet 9, facing the capillary 2, has been vaporized into plasma, so that the thickness of such portion of the dielectric sheet 9 is reduced. In order to compensate for such reduction in thickness, the dielectric sheets 9 are moved in response to the instruction signals from the CPU 117 so that other portions of the surfaces of the sheets 9, not having been subjected to the creeping discharge, encircle the capillary 2. The manner of such sliding movement of the sheets 9 is illustrated in FIGS. 2B and 2C. In the perspective view of FIG. 2C, only the insulator segments 8 and portions of the dielectric sheets 9, forming the capillary 2, are illustrated, and the illustration of the other components such as the electrodes is omitted. As seen from FIGS. 2B and 2C, the dielectric sheets 9 are moved in the directions of the arrows depicted. The dielectric sheets 9 may be moved continuously or interruptedly. For the latter case, the dielectric sheets 9 may be moved in response to completion of single discharging operation or, alternatively, in response to completion of plural-time discharging operations. For this purpose, the CPU 117 actuates switching means SW (FIG. 3) once or by plural times as desired so as to allow that the voltage −HV is applied to the electrodes 3 and 4 and the cathode 6 by way of the resistor Ra. It is a possible alternative that the intensity of the X-rays produced or the intensity of light emitted with the emission of the X-rays, may be monitored so that the movement of the dielectric sheets 9 is controlled in accordance with the monitored intensity.

Referring now to FIGS. 4A–5B, description will be made to an X-ray generating device according to another embodiment of the present invention. Like numerals as of the foregoing embodiment are assigned to similar or corresponding elements.

In this embodiment, dielectric sheets are denoted at 9a, and each sheet has a thickness of an order of 1–100 microns. FIG. 5A is a perspective view showing insulator segments 8 and portions of the dielectric sheet 9a, which are cooperative with each other to define a capillary 2. FIG. 5B is a fragmentary view showing a half of the X-ray generating portion of FIG. 5A. As is best seen in FIGS. 5A and 5B, the inner surface of each dielectric sheet 9a, facing the capillary 2, is provided with coatings 10 each formed of a material that contains an element or elements adapted for the emission of X-rays of desired wavelength or wavelength range. The coating 10 is made of metal, alloy, an electrically insulative material, or other suitable material. For example, where emission of X-rays of approx. 4.4 Angstrom in wavelength is desired, metal such as Pd may be applied by vacuum deposition or the like.

When, in operation, the capacitor Cd is charged and a sufficiently high voltage is applied to the insulator segments 8, portions of the dielectric sheets 9a on the insulator segments 8 and the coatings 10 on the sheets 9a, facing the capillary 2, are vaporized due to the creeping discharge in the capillary 2, with the result that plasma 5 is produced. At this time, from the cathode 6, electron beams are projected upon the plasma 5. In response, the temperature of the plasma 5 as well as the plasma density are increased. As a result, X-rays 7 of a wavelength range corresponding to the material of the coatings 10 are produced. Due to the creeping discharge, a portion of the material of the sheet 9a surface, facing the capillary 2, is vaporized into plasma, such that the thickness of such portion of the sheet 9a becomes thinner after emission of the X-rays. In order to compensate for this, the dielectric sheets 9a are slidably moved as in the case of the foregoing embodiment, so that other portions of the sheets 9a not having been subjected to the creeping discharge encircle the capillary 2.

Referring now to FIGS. 6A, 6B and 7, description will be made to an X-ray generating device according to a further embodiment of the present invention. Like numerals as of the foregoing embodiments are assigned to similar or corresponding elements.

As seen from FIGS. 6A–7, the device of the present embodiment includes four elongated insulator segments 8 each having a rectangular shape in cross-section, and four plate-like dielectric members 9b each being sandwiched between two adjacent insulator segments. These insulator segments 8 and dielectric members 9b cooperate with each other to define a capillary 2. More specifically, the capillary 2 is encircled by the four dielectric members 9b. Denoted diagrammatically at 20 in FIG. 6b is an actuator for moving one of the dielectric members 9b along a gap in which the one dielectric member is inserted. While only one actuator is illustrated, the device is actually provided with four actuators for the four dielectric members 9b, respectively. Each dielectric member 9b is made of an electrically insulative material that contains an element or elements adapted for emission of X-rays of a desired wavelength range. For example, where emission of X-rays for carbon is desired, the dielectric member 9b may be made of polyethylene. Each insulator segment 8 may be made of the same material as of the dielectric member 9b or, alternatively, it may be made of a different electrically insulative material such as, for example, aluminum oxide $Al_2O_3$. As in the foregoing embodiments, the electrodes 3 and 4, the cathode 6, the insulator segments 8 and the dielectric members 9b are contained in a vacuum chamber.

When, in operation, the capacitor Cd is charged and a sufficiently high electric voltage is applied to each of the insulator segments 8, the surface portions of the dielectric members 9b facing the capillary 2 are vaporized due to the creeping discharge in the capillary 2, with the result that plasma 5 is produced. At this time, from the cathode 6, electron beams are projected upon the plasma 5. In response, the temperature of the plasma 5 as well as the density thereof are increased. As a result, X-rays are generated as depicted at 7 in FIG. 6A.

Due to the creeping discharge, a portion of the material of the surface of each dielectric member 9b, facing the capillary 2, has been vaporized into plasma, so that the dielectric member 9b is reduced by a corresponding amount. In order to compensate for such reduction, the dielectric members 9b are slidingly moved toward the center of the capillary 2.

The manner of such sliding movement of the members 9b is illustrated in FIG. 7. In the perspective view of FIG. 7, only the insulator segments 8 and portions of the dielectric members 9b, forming the capillary 2, are illustrated, and the illustration of the other components such as the electrodes is omitted. As seen from FIG. 7, the dielectric members 9b are moved in the directions of arrows depicted. The dielectric members 9b may be moved continuously or interruptedly. For the latter case, the dielectric members 9b may be moved in response to completion of single discharging operation or, alternatively, in response to completion of pluraltime (e.g., several or several tens) discharging operations. The movement of the dielectric member 9b may be made at suitable timing, on the basis of measurement of the degree of reduction of the dielectric member. The reduction can be measured in various ways. For example, two opposed dielectric members are moved toward the center of the capillary until they contact with each other. From the amount of movement made at that time, the degree of reduction can be determined. Where a suitable mechanism is provided to change the clearance between adjacent insulator segments 8 and where such mechanism is used to enlarge the clearance upon movement of the dielectric member, the movement of the dielectric member can be facilitated. This is also the case with the foregoing embodiments, and the movement of the dielectric sheet 9 can be facilitated similarly.

Figure 8A:
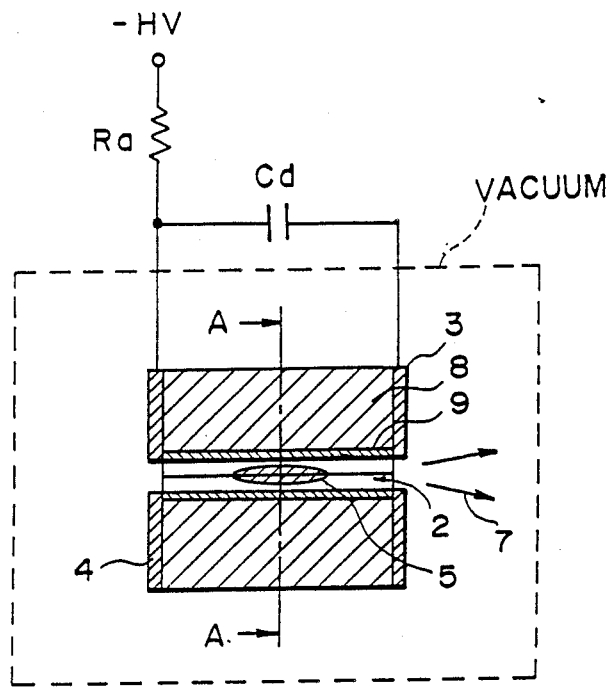
FIGS. 8A-8C are vertical sections, respectively, schematically showing X-ray generating devices according to further embodiments of the present
Figure 8B:
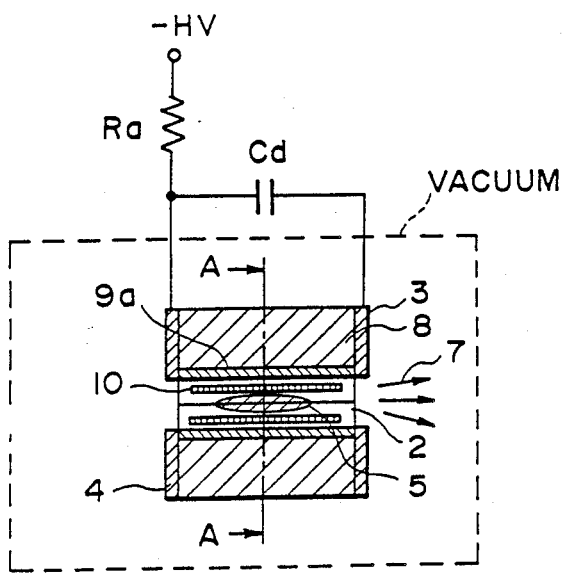
Figure 8C:
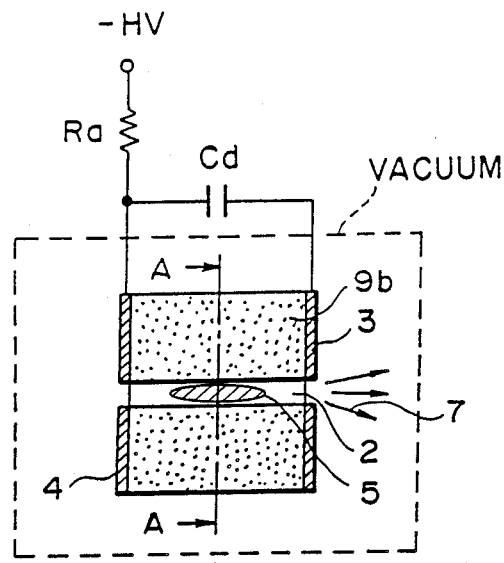

Use of the cathode 6 in the above-described embodiments is not limitative. That is, the electrical arrangement of the X-ray generating device can be modified in various ways. Examples are illustrated in FIGS. 8A-8C. Since the arrangements illustrated in FIGS. 8A-8C will be self-explanatory in view of the foregoing description, specific description of these examples are omitted here only for the sake of simplicity.

Figure 4B:
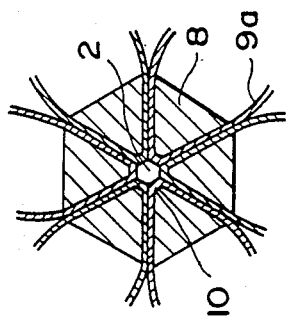
FIG. 4B is a cross-sectional view, taken on a dash-and-dot line in FIG. 4A and as viewed in the direction of arrows A.
Figure 4A:
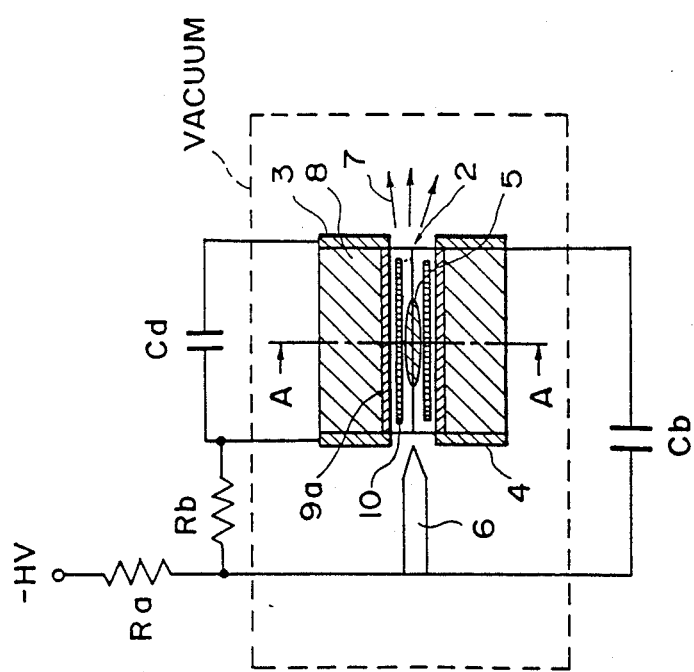
FIG. 4A is a vertical section schematically showing an X-ray generating device according to another embodiment of the present invention.
Figure 9:
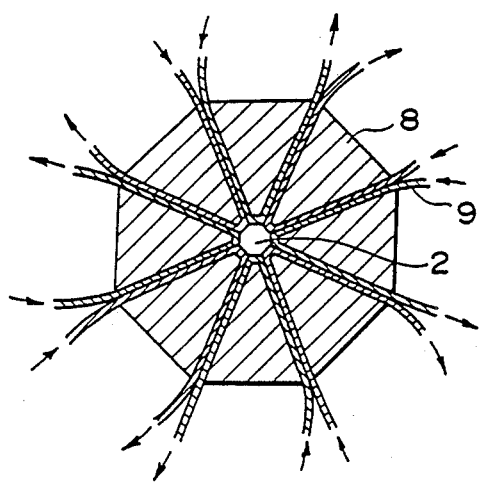

The X-ray generating portion comprising the insulator segments 8 and the dielectric sheets 9 or 9a, forming the capillary 2, in the embodiments of FIGS. 2A and 4A can be modified in various ways. Examples are illustrated in FIGS. 9-11. Each of FIGS. 9-11 is a cross-sectional view corresponding to FIG. 2B or 4B. In the case of FIG. 9, the insulator means comprises eight insulator segments 8. In the case of FIG. 10, the insulator means comprises four insulator segments 8 having shapes as depicted in this Figure. Four dielectric sheets 9 are used in this example, and these dielectric sheets 9 are made slidable along the surfaces of the insulator segments 8, respectively, in the manner as illustrated. In the case of FIG. 11, each insulator segment 8 is made into a rotatable roller which serves also as a feeding roller to facilitate movement of the dielectric sheets 9.

In the embodiment described with reference to FIGS. 4A-5B, the pattern of the coatings 10 applied to the dielectric sheet 9a can be changed in various ways. An example is illustrated in FIG. 12 which is a view similar to FIG. 5B. It is a possible alternative that only one or some of the plural dielectric sheets 9a, defining the capillary, are provided with the coatings 10. Further, different dielectric sheets may be coated with different materials. The coating 10 can be formed on the dielectric sheet 9a by vacuum deposition, plating, dipping or any other suitable method.

The X-ray generating portion of the FIG. 6A embodiment, comprising the insulator segments 8 and the dielectric members 9b, cooperate with each other to define the capillary 2, may be modified in various ways. Examples are illustrated in FIGS. 13, 14A and 14B. In the case of FIG. 13, which is a cross-sectional view similar to FIG. 6B, eight insulator segments 8 and eight dielectric members 9b are used. In the case of FIGS. 14A and 14B, each dielectric members 9b is divided into three in a direction parallel to the capillary 2. The arrangement of this example is preferable in the point that any local reduction or consumption of the dielectric member can be made up for.

Figure 15B:
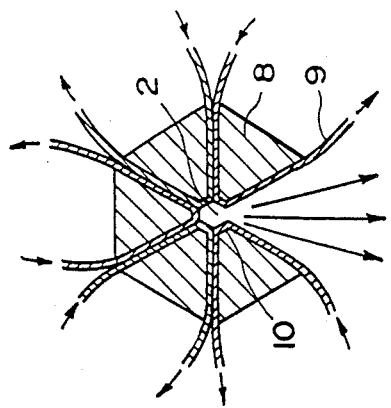
FIG. 15B is a cross-sectional view, taken on a dash-and-dot line in FIG. 15A and as viewed in the direction of arrows A.
Figure 15A:
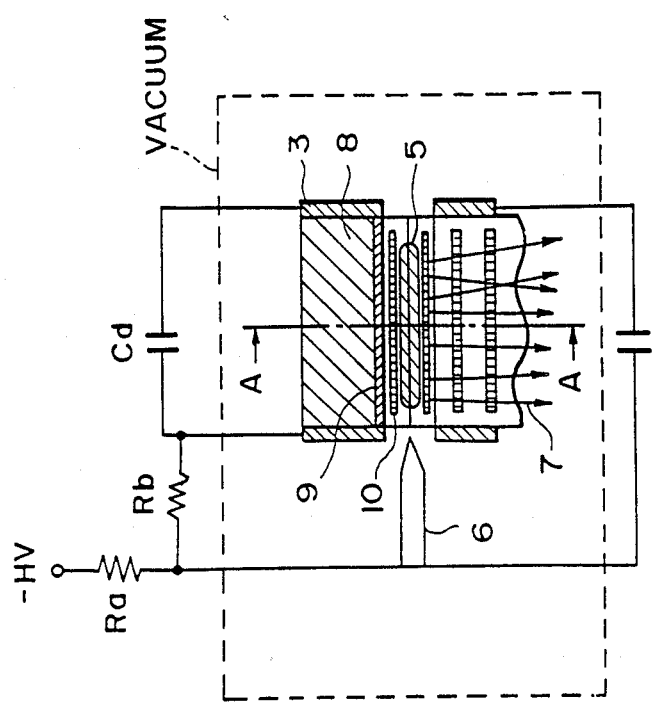
FIG. 15A is a vertical section schematically showing an X-ray generating device according to a yet further embodiment of the present invention.

Referring now to FIGS. 15A and 15B, there is shown an X-ray generating device according to a still further embodiment of the present invention. As will be described later, the X-ray generating device of the present embodiment is arranged to provide a linear X-ray source. Like numerals as of the foregoing embodiments are assigned to similar or corresponding elements.

Essentially, the device of the present embodiment corresponds to a modified form of the FIG. 4 embodiment in which form one of the insulator segments 8 and corresponding one of the dielectric sheets 9 in the FIG. 4A embodiment are omitted. That is, the X-rays 7 are emitted downwardly as viewed in FIGS. 15A and 15B, from the capillary 2 and through a space which has been occupied by the one insulator segment and the one dielectric sheet in the FIG. 4A embodiment. In this manner, the device of the present embodiment provides a linear X-ray source. Also, in the present embodiment, the capillary 2 is defined by a wall provided by portions of the dielectric sheets 9, and these portions of the dielectric sheets 9 facing the capillary 2 can be renewed as a result of the sliding movement of the sheets 9. Accordingly, the reduction or consumption of the sheet 9 portion, facing the capillary 2 due to the vaporization into the plasma, can be compensated for or made up for by the displacement of the sheet 9.

While the electrode 3 of the present embodiment is formed with a central opening as in the FIG. 4A embodiment, the electrode 3 may be formed without such opening in order to block leakage of X-rays from such opening.

Figure 16:
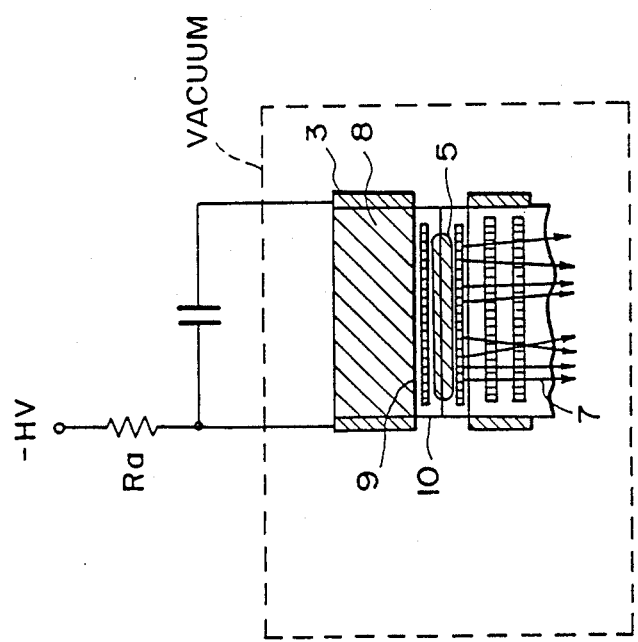
FIG. 16 is a view similar to FIG. 15 but showing a modified form of X-ray generating device.

The electrical arrangement of the FIG. 15A embodiment, for the generation of plasma, may of course be modified in the same way as described hereinbefore, i.e. in the manner as illustrated in FIG. 16.

Figure 17:
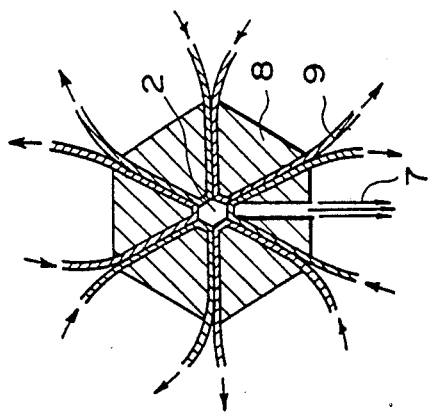
FIG. 17 is a cross-sectional view showing a modified form of X-ray generating portion.

FIG. 17 shows a modified form of X-ray generating portion which is arranged to provide a linear X-ray source. Essentially, the example of FIG. 17 corresponds to a modified form of the FIG. 2B arrangement, in which form one of the insulator segments 8 is divided into two so as to define therebetween a gap allowing passage of X-rays downwardly as viewed in FIG. 17. More particularly, the X-rays emitted from the capillary 2 pass through one of the dielectric sheets 9 and advance along the gap defined between the divided halves of the one insulator segment 8. The thickness of such one dielectric sheet 9, extending around the divided insulator segment 8 may preferably be made thinner than that of the other dielectric sheets, in order to improve the intensity of the X-rays as obtainable from the X-ray generating portion. Also, a different material may be used as such one dielectric sheet, for the same purpose.

The arrangement of FIG. 17 is preferable in the following points:

(1) Dispersion of plasma can be effectively prevented, which makes it easy to produce high-temperature and high-density plasma.

(2) Unpreferable scatter of plasma can be effectively prevented, which makes it easy to avoid contamination of a mask or a partition window (a window through which X-rays pass) where the X-ray generating device is used in a semiconductor device manufacturing X-ray exposure apparatus.

(3) Selection of suitable size for the insulator segment 8, which is divided into two, allows that the X-rays 7 are collimated to some degree with respect to the horizontal direction as viewed in FIG. 17.

Figure 18:
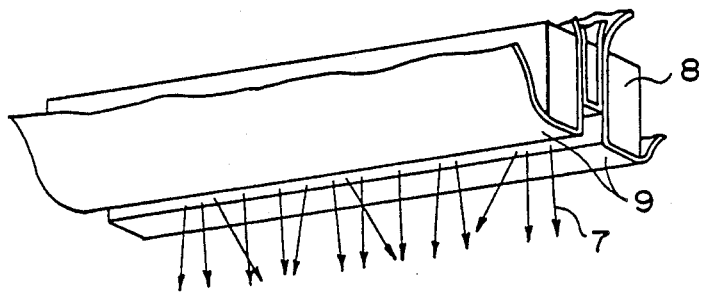
FIG. 18 is a fragmentary and perspective view showing another example of an X-ray generating portion.

In addition to the examples described hereinbefore, the X-ray generating portion comprising the insulator segments 8 and the dielectric sheets 9, forming the capillary, can be modified in various other ways. An example is illustrated in FIG. 18. In this example, three insulator segments 8 and three dielectric sheets 9 cooperate with each other to define a groove having a channel-shape in cross-section. As illustrated, X-rays 7 are emitted from the groove and, thus, the illustrated arrangement provides a linear X-ray source.

Subsequently, description will be made to another aspect of the present invention. In this aspect, the invention is applied to an X-ray exposure apparatus using an X-ray generating device which may be of the type described hereinbefore.

The X-ray exposure apparatus of the present embodiment is of the proximity type using pseudoparallel or approximately parallel X-rays. Briefly, in order to solve the particular problems described in the introductory part of this Specification, the X-ray exposure apparatus according to one preferred form of the present invention is provided with first control means for variably controlling the size or amount of penumbral shadow on the resist surface, on the basis of a desired value set with reference to the line width of a resist pattern to be formed after the developing process, and second control means for controlling the quantity of X-ray irradiation so as to assure a predetermined "remaining resist thickness" which is the thickness of the resist layer or material remaining on the wafer after completion of the developing process.

For the control of the amount of penumbral shadow, the first control means comprises, in one preferred form of the invention, gap control means for variably controlling the proximity gap between a mask and a wafer, and/or means for changing the degree of parallelism of the approximately parallel X-rays. As an example, the parallelism changing means comprises a solar-slit changer adapted to interchangeably use separate solar slits having different aperture ratios.

In one preferred form of the invention, the second control means comprises means for controlling the time of irradiation of the resist material with the X-rays where it is desired to maintain a predetermined constant intensity of irradiation of the X-rays on the surface of the resist material. In accordance with another preferred form of the invention, the second control means comprises means for variably controlling the intensity of irradiation of the X-rays, on the surface of the resist material, where it is desired to maintain a predetermined constant time of irradiation of the X-rays in view of the throughput of the exposure apparatus.

In the proximity exposure using approximately parallel X-rays, the difference between the width of line of a mask pattern and the width of line of a resist pattern corresponding to the mask pattern and formed by the developing process, chiefly depends on the magnitude of the penumbral shadow and the quantity of X-ray irradiation of the resist material. The amount of penumbral shadow is variable in accordance with the degree of parallelism of the X-rays and the size of the proximity gap between the mask and the wafer. On the other hand, the quantity of X-ray irradiation of the resist material has an effect upon the normalized resist thickness and, thus, upon the line width of the resist pattern. The normalized resist thickness is a proportion of the thickness of the resist material, remaining after the developing process, to the thickness of the resist material originally applied to the wafer.

In the X-ray exposure apparatus according to one preferred form of the present invention, the amount of penumbral shadow is controlled by use of the first control means and on the basis of a desired value set with respect to the line width of the resist pattern. At the same time, the quantity of irradiation of the resist material with the X-rays is controlled by use of the second control means so as to assure a desired "remaining resist thickness". In other words, by specifically controlling the amount of penumbral shadow and the quantity of X-ray irradiation, the line width of the resist pattern can be very accurately and precisely controlled.

These features and advantageous effects of the present invention will now be described in more detail, taken in conjunction with FIGS. 19–25.

Referring to FIG. 19, there is shown an X-ray exposure apparatus according to an embodiment of the present invention. As illustrated, the apparatus includes an exposure system which comprises a linear type X-ray source 1 for producing X-rays denoted at 102, a plurality of solar slits (collimators) 103 each of which serves as collimating means for limiting the degree of parallelism of the X-rays 102 within a predetermined range. A mask 104 has formed on its lower surface a pattern 105 made of a material adapted to absorb X-rays. A wafer 107 has a surface layer 106 which is made of a suitable resist material. By use of the collimated X-rays 102, the resist layer 106 of the wafer 107 is exposed to the mask pattern 105 with a minute gap being maintained between the mask 104 (pattern 105) and the wafer 107 (resist layer 106). A slit changer 109 is provided to interchangeably use a desired one of the solar slits 103. The wafer 107 is held by a wafer chuck 108 by use of an electromagnetic attracting force, and is made movable with the mask 104 in a direction transversing the X-rays irradiated. The movement of the mask 104 and the wafer 107 is controlled by means of a drive controlling unit 114. The gap between the wafer and the mask can be made variable by means of a gap adjusting unit 111 which is operated under the control of a gap controlling unit 113. Disposed above the mask 104 is an X-ray detector 110 which is adapted to detect the intensity of the X-rays from the solar slit 103 used. Also, there is provided a gap sensor 112 for detecting the gap between the mask and the wafer. Outputs of the detector and sensor, i.e. the detected data concerning the X-ray intensity and the proximity gap, are supplied by way of an interface 116 to a central processing unit 117 (hereinafter "CPU"). In response to the supplied data and in accordance with various information and programmed data preparatorily stored in a memory 118, the CPU 117 operates to control the slit changer 109, the gap controlling unit 113, the drive control unit 114, etc.

The principle of control of the width of line of a resist pattern, used in the present invention, will be described below.

While many proposals have been made as to the "collimation" of X-rays, in this particular embodiment a linear type X-ray source of the type disclosed in FIG. 16 is used in combination with the solar slit means. The positional relation of the X-ray generating device, the solar slit means, the mask and the wafer, in this case, is illustrated in detail in FIG. 20. Like numerals as of the FIG. 19 arrangement are assigned to corresponding elements. Denoted in FIG. 20 at 104a is a mask frame. The character Va denotes a high-vacuum chamber. As seen from the drawing, the X-ray generating portion of the X-ray source is accommodated in the high-vacuum chamber Va. Denoted at 127 is a partition window of known type which is effective to separate the high-vacuum chamber Va from another chamber (not shown) for accommodating the solar slit 103 and the like, while allowing passage of the X-rays from the source to the solar slit 103 but without allowing fluid communication between these chambers. As a matter of course, the linear-type X-ray source used in the FIG. 20 embodiment may be replaced by an X-ray source of the type disclosed in FIG. 15A, 17 or 18. Also, a linear-type X-ray source or an area-type X-ray source such as disclosed in Japanese Laid-Open Patent Applications, Laid-Open Nos. 119838/1984, 127837/1984 and 34018/1985 may be used in combination with a solar slit.

Figure 21B:
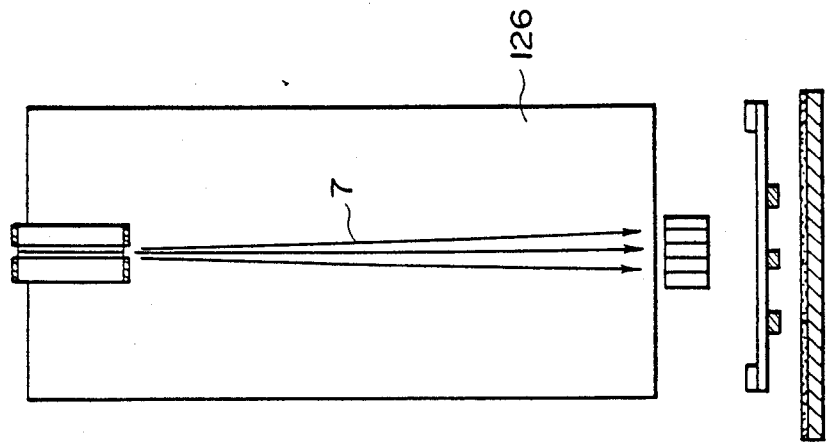
FIG. 21B shows the apparatus of FIG. 21A, as viewed in the direction of arrows A indicated in FIG. 21A.
Figure 21A:
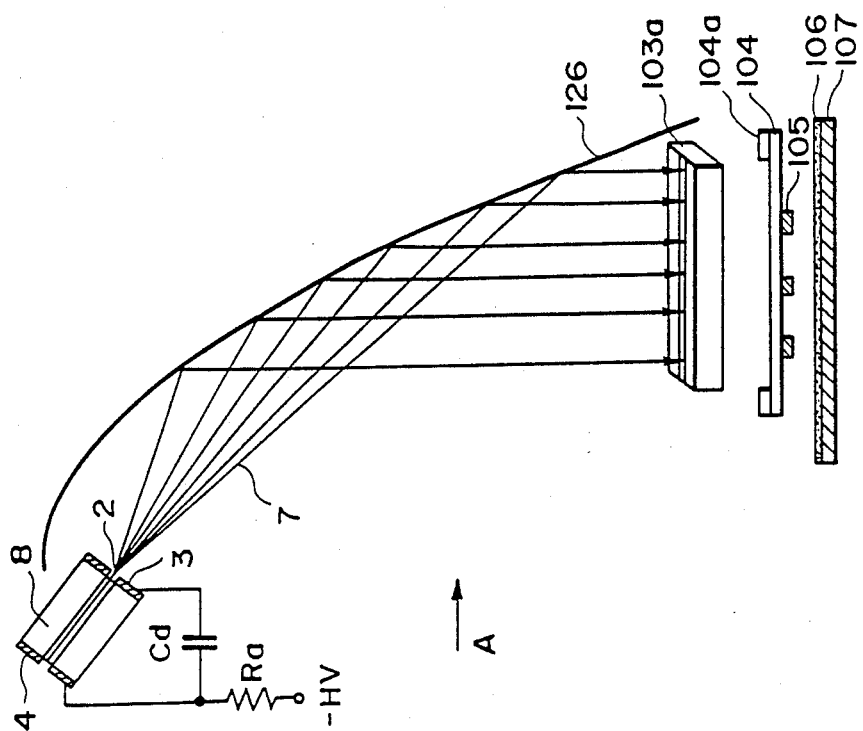
FIG. 21A is a schematic view of an X-ray exposure apparatus according to another embodiment of the present invention.

In accordance with one aspect of the present invention, an X-ray generating device of the type disclosed in FIG. 8A can be used as a linear-type X-ray source. If it is desired, the X-ray generating device of FIG. 8A may be used in combination with a quadratic-curve reflecting mirror to provide the X-ray source 101 of the FIG. 19 embodiment. Details of such arrangement are illustrated in FIGS. 21A and 21B. Denoted in these Figures at 126 is a total reflecting mirror having a quadratically curved surface and adapted to reflect X-rays. The X-ray emitting port of the capillary 2 is disposed at a focal point position of the reflecting mirror 126. With the arrangement of FIG. 21A, the X-rays from the capillary 2 is substantially collimated by means of the reflecting mirror 126, with respect to the horizontal direction as viewed in FIG. 21A. Therefore, the solar slit 103a in this example is provided by a plurality of flat plates each extending in a direction parallel to the sheet of the drawing. For ease in understanding, only the solar solit 103a is illustrated in a perspective view. In order to assure improved "collimation" with respect to the horizontal direction as viewed in this Figure, another solar slit which comprises a plurality of plate members extending perpendicularly to the sheet of the drawing and to the plane of the mask 104, may be added. For ease in understanding, the X-rays 7 incident upon the reflecting mirror 126 are depicted as having large glancing angles. Actually, however, the reflecting mirror 126 is so disposed that almost all the X-rays from the source are incident upon the mirror 126 with the glancing angles of an order of 1-2 degrees. FIG. 21B side view of the apparatus of FIG. 21A, as viewed in the direction of an arrows A. As a matter of course, the X-ray source of this example may be replaced by an X-ray source of the type disclosed in any of FIGS. 2A-14B. Also, the mirror 126 may be replaced by a multi-layered reflecting mirror which is arranged so that X-rays reflected from different layers have the same phase, with the result that the X-rays act upon one another to increase the intensity.

Figure 20:
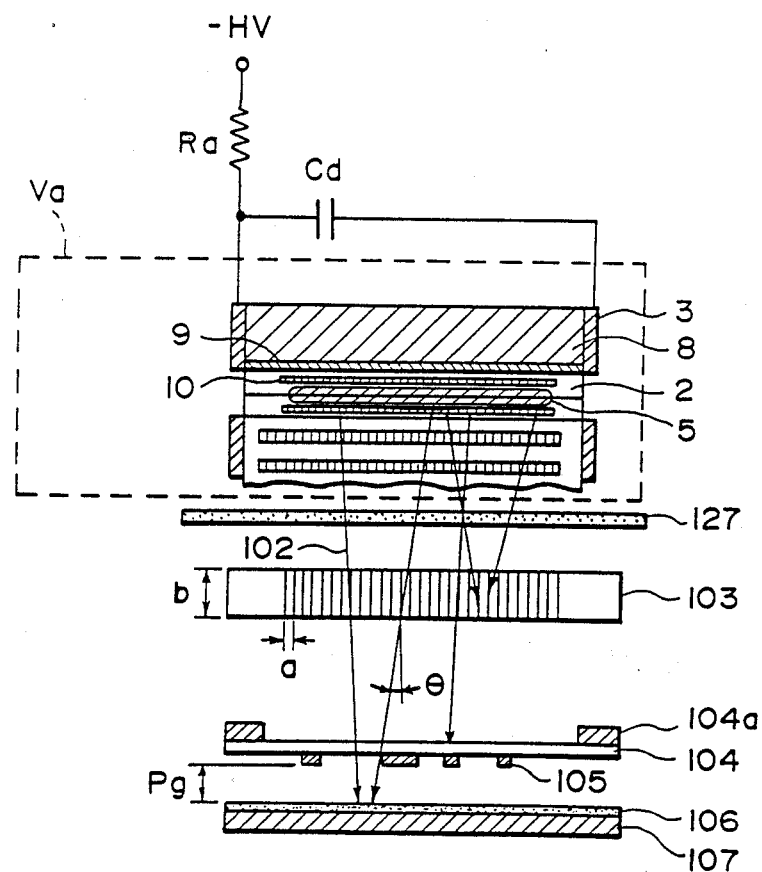
FIG. 20 is a sectional view schematically showing an X-ray generating device and the manner of X-ray exposure, in the apparatus of the FIG. 19 embodiment.
Figure 22:
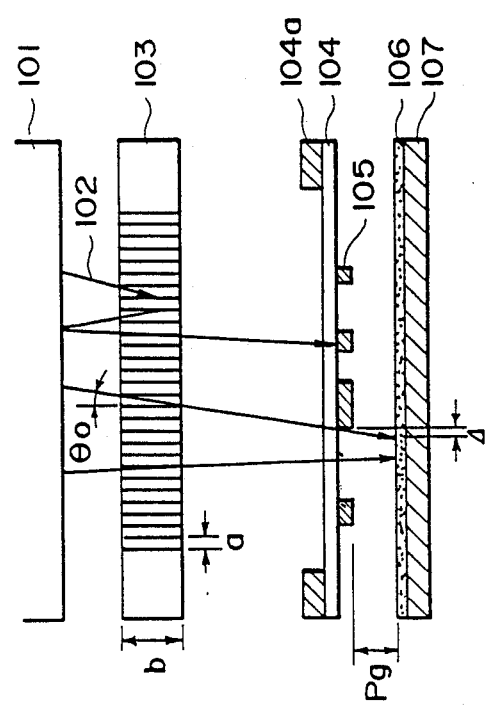
FIG. 22 is a principle view illustrating the manner of proximity exposure using approximately parallel X-rays.

For explanation of the concept of the control of the line width, reference will now be made to FIG. 22 showing details of the manner of X-ray irradiation in the FIG. 20 embodiment.

Among the X-rays 102 emitted from the source 101, only those each having an angle of incidence not greater than an angle $\theta o$ and being capable of passing through the solar slit 103 used, are selected by the solar slit 103. Thus, the mask 104 is irradiated with the X-rays 102 each having the angle of incidence not greater than "$\theta o$". The angle $\theta o$ is determined by the diameter a of the passage of the solar slit 103 and the thickness b of the solar slit 103, and in accordance with the following equation:

$$\theta o = \tan^{-1}(a/b)$$

Accordingly, the degree of parallelism of the X-rays emerging from the slit 103 is maintained within the angular range of "$\theta o$". A portion of the X-rays incident upon the mask 104 is intercepted by the mask pattern 105 made of a material such as Au effective to absorb the X-rays. The X-rays passed through the nonpattern portion of the mask 104 (i.e. the region in which any pattern is not formed) are incident upon the wafer 107, thereby to selectively sensitize the resist material 106 applied to the wafer 107. Practically, in this case, it is preferable and suitable to set the proximity gap Pg within a range of 5-40 microns in order to avoid accidental contact of the mask and the wafer as well as to assure precise pattern transfer. Also, it is preferable and suitable to set the angle $\theta o$ within a range of 0.1-0.01 rad, and the aperture ratio ($=a/b$) of the solar slit 103 is determined so as to satisfy this.

Figure 23:
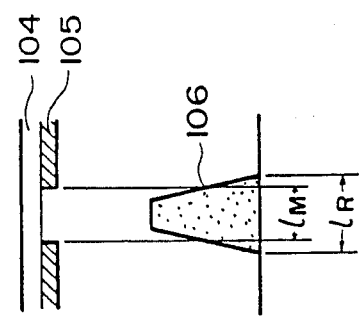
FIG. 23 shows the relation between a mask pattern and a resist pattern.

On the resist 106 surface as selectively irradiated with the X-rays passed through the nonpattern portion of the mask 104, there occur penumbral shadows due to the varying angles of incidence of the X-rays, within the angular range of $\theta o$. As seen from FIG. 22, each penumbral shadow is formed at an edge portion of a selectively exposed area of the resist layer 106. Depending on the magnitude or size of such penumbral shadow, i.e. the magnitude of Δ depicted in FIG. 22, the line width lR of a resist pattern, formed as a result of the selective exposure and the subsequent developing process, will be different from the line width lM which is defined on the mask surface by the mask pattern 105, as illustrated in FIG. 23. The amount of penumbral shadow Δ can be expressed as follows:

$$\begin{aligned}\Delta &= Pg \cdot \tan\theta o \\ &= Pg \cdot a/b \\ &= Pg \cdot Sl\end{aligned} \quad (1)$$

wherein S is the aperture ratio (=a/b) of the solar slit used.

The difference between the resist line width lR and the mask line width lM is caused chiefly by the amount of penumbral shadow $\Delta$. Accordingly, by changing the proximity gap Pg and/or the aperture ratio Sl of the solar slit, the resist line width lR can be controlled as desired.

The difference between the resist line width and the mask line width, described above, depends not only on the amount of penumbral shadow $\Delta$ but also on the quantity of irradiation of the resist material with the X-rays. This will now be described with reference to a particular case using a negative resist.

Figure 24:
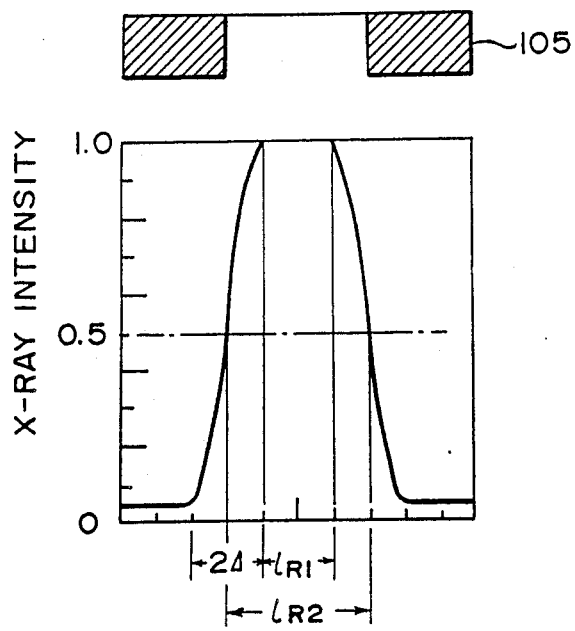
FIG. 24 is a graph showing an X-ray intensity distribution defined just under mask patterns.

For the negative resist, the normalized resist thickness T which is the ratio of the resist thickness, remaining after the developing process, to the thickness of the originally applied resist, is given by the following equation:

$$T = \gamma \cdot \log(D/Do)$$

wherein T is not greater than 1, D is the quantity of irradiation of X-rays with which the resist is actually exposed, Do is the sensitivity of the resist, i.e. the quantity of X-ray irradiation by which the resist starts its gelatinization, and $\gamma$ is the "$\gamma$ value" (resolution) of the negative resist.

Where the etching rate in the succeeding etching process is small, the normalized resist thickness T should be large accordingly, because, if not so, such portion of the substrate as having been masked will be damaged. If, on the other hand, the normalized resist thickness T is too large, a longer exposure time is necessary where the etching rate is large. In some cases, unnecessary resist material will remain. For these reasons, the normalized resist thickness should be suitably adjusted in accordance with the etching process to be executed subsequently and so as to avoid adverse effects upon the substrate. Usually, for the negative resist, the normalized resist thickness T is not less than 0.5.

Where the irradiation of X-rays produces, underneath the mask pattern 105, such an intensity distribution as illustrated in FIG. 24, and when the quantity of X-ray irradiation becomes equal to Do, only such portion of the resist material that is being exposed to the X-rays without being affected by the shading of the mask pattern, starts its reaction by which the material will remain on the wafer even after the execution of the developing process. Therefore, if the developing process is executed to the wafer which has been irradiated with the X-rays by the amount equal to Do, the line width of a resist pattern formed as a result of the development will be equal to lR1 denoted in FIG. 24. With this quantity of X-ray irradiation, the portion of the resist material included in the penumbral shadow (which can be depicted by 2$\Delta$) has not been sufficiently sensitized by the X-rays. Accordingly, a sufficient material will not remain after the execution of the development. If, on the other hand, the quantity of X-ray irradiation increases to an amount equal to "2Do", then the portion of the resist layer that can be irradiated with the X-rays only by approximately a half of the quantity of irradiation by which the portion of the resist layer not affected by the shading of the mask pattern is irradiated, namely such an area of the resist material as having been irradiated with the X-rays of an intensity "0.5", is exposed to the X-rays by an amount greater than Do. Therefore, the material of the portion of the resist layer, corresponding to the penumbral shadow can remain on the wafer after execution of the developing process. The line width of the resist pattern obtainable in such case is lR2. Also, the normalized resist thickness T at the peak portion can be expressed as follows:

$$T = \gamma \cdot \log(2Do/Do) \approx 0.3$$

As described, the line width of the resist pattern is variable with the increase/decrease in the quantity of irradiation of the resist material with the X-rays. Further, as will be readily understood from FIG. 24, the line width of the resist pattern is also variable with the amount of penumbral shadow. Accordingly, by adjusting the amount of penumbral shadow ($\Delta$) as well as the quantity of X-ray irradiation, the line width of the resist pattern can be controlled more precisely.

Figure 25:
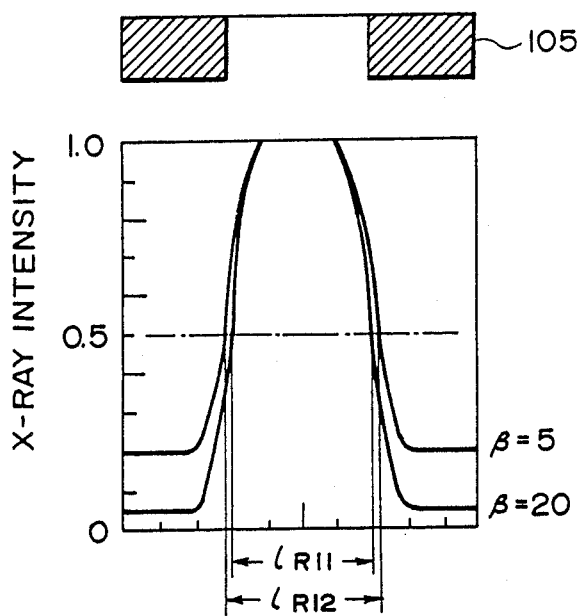
FIG. 25 is a graph showing changes in the X-ray intensity distribution, due to the difference in mask contrast.

Other than the amount of penumbral shadow ($\Delta$) and the quantity of X-ray irradiation (D), there are factors which affect the line width of the resist pattern. For example, the line width (lR) of the resist pattern is affected by the contrast ($\beta$) of the mask used. The mask contrast is a ratio of the intensity of X-rays as transmitted through the nonpattern portion of the mask to the intensity of X-rays as transmitted through the pattern portion of the mask. FIG. 25 shows X-ray intensity distributions obtained with two different mask contrasts, $\beta=20$ and $\beta=5$. For the quantity of X-ray irradiation D=2,Do, the line width of the resist pattern was $lR_{11}$ with the mask contrast $\beta=20$, while it was $lR_{12}$ with the mask contrast $\beta=5$, wherein $lR_{12} > lR_{11}$. As described, the change in the mask contrast $\beta$ leads to changes in the line width of the resist pattern. It is therefore preferable to determine the line-width control for the resist pattern while taking into account the contrast $\beta$ of the mask used, which is changeable, e.g., with the replacement of X-ray source or the changes in the effective wavelength of X-rays due to contamination or for any other reason.

In the proximity exposure using X-rays, as described hereinbefore, the line width of the resist pattern, to be formed as a result of the development, is affected by various factors such as, for example, the line width lM of the mask, the quantity D of X-ray irradiation, the mask contrast $\beta$, the proximity gap Pg, the aperture ratio Sl of the slit used, etc. For the negative resist, where the amount $\Delta$ of penumbral shadow is denoted by $\Delta = Pg \cdot S_2$ and the "$\gamma$ value" of the resist material is denoted by $\gamma$, and if $2\Delta \leq lM$, then the line width lR of the resist pattern obtainable after the development can be expressed as a function of these factors, such as follows:

$$lR = f_2(lM, \Delta, 1/\beta, Do/D) \quad (2)$$

As for the important features required in an exposure apparatus, the wafer processing ability per unit time, i.e. the throughput, is one of such features. The throughput is chiefly determined by the exposure time t required. On the other hand, when the aperture ratio Sl of the solar slit is made small, the quantity of X-rays passing through the solar slit is reduced with the result that the density of X-rays impinging upon the wafer is decreased. Accordingly, the exposure time t can be expressed as a function of the quantity D of X-ray irradiation and the aperture ratio Sl of the solar slit, such as follows:

ti $t = f_3(D, Sl)$  (3)

From this, it will be understood that, within the scope of the present invention, the line width of the resist pattern can be controlled while using the exposure time t as one of the control parameters, from the viewpoint of throughput, as well as the configuration of the resist pattern.

Briefly, in the X-ray exposure apparatus according to the present invention, when particular conditions such as, for example, a desired line width of a resist pattern and characteristics of a mask and a resist material to be used are specified as "set values", optimum values concerning the other exposure conditions that should be coordinated with the specified conditions are determined by calculations, and then the "exposure" is executed in accordance with the thus specified and determined conditions.

For determination of the optimum exposure conditions, they may be determined on the basis of data obtainable from experiments, simulations or the like. Alternatively, calculations may be made by use of functions determined by analysis or by use of approximating equations.

As for the "particular conditions" to be first specified upon determination of the optimum exposure conditions, any one or ones may be selected as desired. As an example, description will now be made to the manner of determination of an optimum amount of penumbral shadow and an optimum quantity of X-ray irradiation in a case where a desired line width of a resist pattern and a desired "normalized resist thickness" have been specified in respect to a particular mask and a particular resist material.

In this exemplary case, the mask has a contrast $\beta = 10$ and a line width of 0.45 micron. For such mask, a resist line-width in the range of 0.45–0.50 micron is desired. The resist material used has a "$\gamma$ value" $\gamma = 1.5$. Also, a normalized resist thickness $T = 0.53$ has been specified in view of an etching process to be executed succeedingly. Under these conditions, the aperture ratio Sl of the solar slit and the proximity gap Pg are controllably adjusted so as to provide the amount $\Delta$ of penumbral shadow in a range of 0.1–0.2 micron. Also, the quantity D of X-ray irradiation is controlled so as to satisfy $D = 2.25Do$ since $T = \gamma \cdot \log(D/Do)$ wherein $T = 0.53$ and $\gamma = 1.5$.

The exemplary case will be described further, taken in conjunction with the X-ray exposure to be executed in the apparatus shown in FIG. 19.

In the arrangement of FIG. 19, the X-rays 102 emitted from the source 101 is substantially collimated by means of the solar slit 103, whereby only such X-rays as having an angle of incidence not greater than an angle $\theta_o$ are extracted. This angular range $\theta_o$ is determined by the slit diameter a and the thickness b of the solar slit 103 and, thus, in accordance with the following equation:

$\theta_o = \tan^{-1}(a/b)$

The "collimated" X-rays are selectively attenuated by the X-ray absorbing pattern 105 formed on the mask 104 and, thereafter, are incident upon the resist material 106 applied to the wafer 107 surface. By this, the resist material 106 is patterningly exposed to the X-rays.

Details of the process of such "exposure" are (1) First, various data concerning the characteristics of materials to be used and the conditions to be specified as the "particular conditions" are stored into the memory 118. In this particular case, $\beta = 10$, $1M = 0.45$ micron, $\gamma = 1.5$, the resist sensitivity $= Do$, a desired resist line-width $lR = 0.50$ micron and the desired "normalized resist thickness" $T = 0.53$, as described hereinbefore.

(2) On the basis of the conditions having been specified at Step (1), the amount of penumbral shadow ($\Delta 0.2$ micron) and the quantity of X-ray irradiation ($D = 2.25Do$) are calculated by means of the CPU 117. Also, calculations are made to determine various combinations of (i) values of the aperture ratios Sl of all the solar slits 103 used in the apparatus, with (ii) appropriate values for the proximity gap Pg to be established in association with the aperture ratios. Further, one of these combinations in which the proximity gap Pg is within the above-described range of 5–40 microns and which has a largest aperture ratio Sl, is selected. Also, from the set value Do concerning the sensitivity of the resist material used, the actual quantity D of X-ray irradiation is determined. The reason why the combination having the largest aperture ratio Sl is selected is that, since the value of aperture ratio Sl have an effect upon the throughput of the apparatus as will be seen from equation (3), the throughput can be improved with a larger aperture ratio.

(3) Subsequently, in order to satisfy the value Pg as determined at Step (2), the gap control unit 113 is actuated to adjust the proximity gap between the mask 104 and the wafer 107 by use of the gap adjusting unit 111, while feeding back output signals of the gap sensor 112 by way of the interface 116.

(4) Also, the slit changer 109 is actuated to select an appropriate one of the solar slits 103 as having the aperture ratio Sl determined at Step (2) and to place the selected slit 103 in a predetermined position for receiving the X-rays 102.

(5) Then, while monitoring output signals from the X-ray detector 110 by way of the interface 116, the drive control unit 114 is actuated to move the wafer chuck 108 by use of the driving unit 115, so as to control the time of irradiation of the resist material with the X-rays to assure the quantity D of X-ray irradiation as determined at Step (2).

With the above-described operations, a resist pattern having the desired line width of 0.50 micron can be transferred onto the wafer with the specified "normalized resist thickness".

While, in the above particular example, description has been made to a case using a negative type resist material, the line-width control is attainable also for other type resist materials substantially in the same manner and by use of results of simulations or analysis corresponding to the resist material used.

Also, in the above-described example, if the by the angle $\theta_o$, i.e. the aperture ratio Sl of the solar slit is made small, the intensity of X-rays passing through the solar slit is, of course, decreased accordingly. As a result, it is necessary to prolong the exposure time t in order to ensure the same quantity of X-ray irradiation.

If, however, the exposure time t should be fixedly set from the viewpoint of throughput, the line-width control can be made, first, by determining the exposure time t and the values such as IR, IM, β, Do while taking into account the above-described equation (3), and, second, by determining from equations (1)–(3) the relation between the amount Δ of penumbral shadow and the quantity D of X-ray irradiation as well as the relation between the aperture ratio Sl and the proximity gap Pg. As in the foregoing example, calculations are made to determine various combinations of (i) values of the aperture ratios Sl of all the solar slits 103, used in the apparatus, with (ii) appropriate values for the proximity gap Pg, and then a most appropriate combination wherein the proximity gap Pg is within the above-described range and which has an aperture ratio Sl that is effective to provide the quantity D of X-ray irradiation most suitable for the treatment in the succeeding process, is selected. Then, the system is controllably operated to satisfy the thus determined values of Sl, Pg and D. By this, a resist pattern of desired line width can be transferred with the desired throughput.

It should be noted that the concept of line-width control of the present invention is applicable unlimitedly to the proximity exposure using substantially parallel X-rays. The "collimator" means is not limited to a combination of a plasma type or tube type X-ray source with a solar slit. For example, any type of X-ray generating device such as, typically, a synchrotron orbit radiation (SOR) type X-ray generating device, capable of producing substantially parallel X-rays may of course be usable.

In accordance with the above-described aspect of the present invention, the amount of penumbral shadow and the quantity of X-ray irradiation in the proximity exposure using substantially parallel X-rays, can be controlled in an optimum manner under some specified conditions, to ensure a desired line width of a resist pattern. Accordingly, this aspect of the present invention assures precise control of the line width of the resist pattern, such that a predetermined and constant relation is stably established between the line width of the mask pattern and the line width of the resist pattern.

While the invention has been described with reference to the structures disclosed herein, it is not confined to the details set forth and this application is intended to cover such modifications or changes as many come within the purposes of the improvements or the scope of the following claims.

What is claimed is:

1. A device for generating X-rays, comprising:
   means for producing plasma in a predetermined space, for generation of the X-rays; and
   wall means effective to define a surface substantially surrounding said space, said wall means including a portion which is made of a dielectric material and which is made movable so as to compensate for consumption of the dielectric material due to the production of the plasma by said plasma producing means, wherein said dielectric portion of said wall means includes a plurality of sheet-like dielectric members and wherein said surface substantially surrounding said space is defined by cooperation of portions of surfaces of said sheet-like dielectric members.

2. A device according to claim 1, wherein each of said sheet-like dielectric members is arranged to move so that a surface portion thereof facing said space is replaced by another surface portion after the material forming the first-mentioned portion is at least partially consumed by the production of the plasma.

3. A device according to claim 2, wherein each of said sheet-like dielectric members is made of polyethylene.

4. A device according to claim 2, wherein each of said sheet-like dielectric members has a material applied to its surface and effective to generate X-rays of a desired wavelength.

5. A device for generating X-rays, comprising:
   means for producing plasma in a predetermined space, for generation of the X-rays; and
   wall means effective to define a surface substantially surrounding said space, said wall means including a portion which is made of a dielectric material and which is made movable so as to compensate for consumption of the dielectric material due to the production of the plasma by said plasma producing means, wherein said dielectric portion includes a plurality of dielectric members each having a surface and wherein portions of the surfaces of said dielectric members cooperate to define said surface substantially surrounding said space.

6. A device according to claim 5, wherein each of said dielectric members is arranged to move toward said space in which the plasma is produced, and by an amount corresponding to the amount of reduction of the dielectric material forming the surface of said dielectric member that forms said surface substantially surrounding said space.

7. A device according to claim 1, wherein said wall means is effective to define said surface so that it forms said space into an elongated shape.

8. A device according to claim 7, wherein said wall mean defines an opening through which the X-rays generated in said space are emitted.

9. A device according to claim 7, wherein said wall means is arranged so that, when the generated X-rays are emitted, the X-rays pass through a portion of said surface substantially surrounding said space.

10. A device according to claim 1, wherein said wall means is arranged to define a groove, said groove having an inner surface effective to substantially surround said space.

11. A device for generating X-rays, comprising:
    means for producing plasma in a predetermined space, for generation of the X-rays; and
    wall means effective to define a surface substantially surrounding said space, said wall means including a portion which is made of a dielectric material and which is made movable so as to compensate for consumption of the dielectric material due to the production of the plasma by said plasma producing means, wherein said wall means includes means for moving said dielectric portion.

12. A device according to claim 11, wherein said wall means includes means for controlling said moving means.

13. A device according to claim 12, wherein said plasma producing means includes means for causing creeping discharge along said surface, and wherein said controlling means is effective also to control said creeping discharge causing means.

14. A device according to claim 13, wherein said controlling means is arranged to actuate said moving means each time said creeping discharge causing means operates to cause the creeping discharge once or by a predetermined number of times.

* * * * *

UNITED STATES PATENT AND TRADEMARK OFFICE
CERTIFICATE OF CORRECTION

PATENT NO. : 4,935,947

DATED : June 19, 1990

INVENTOR(S) : Mitsuaki Amemiya

Page 1 of 3

It is certified that error appears in the above-identified patent and that said Letters Patent is hereby corrected as shown below:

ON THE TITLE PAGE

IN THE ABSTRACT

Line 4, "uni" should read --unit--.

COLUMN 2

Line 41, "5" should be deleted.

COLUMN 3

Line 29, "present" should read --present invention.--.

COLUMN 4

Line 61, "electrode 3 and 4," should read --electrodes 3 and 4,--.

COLUMN 7

Line 31, "pluraltime" should read --plural-time--.

UNITED STATES PATENT AND TRADEMARK OFFICE
CERTIFICATE OF CORRECTION

PATENT NO. : 4,935,947

DATED : June 19, 1990

INVENTOR(S) : Mitsuaki Amemiya

It is certified that error appears in the above-identified patent and that said Letters Patent is hereby corrected as shown below:

COLUMN 11

Line 58, "is" should read --are--; and
Line 63, "solar solit" should read --solar slit--.

COLUMN 12

Line 9, "arrows A." should read --arrow A.--; and
Line 25, "103 used, are" should read --103, are--.

COLUMN 14

Line 13, "$T=\gamma \cdot \log(2Do/Do) \approx 0.3$" should read --$T=\gamma \cdot \log(2Do/Do) \approx 0.3\gamma$--.

COLUMN 15

Line 7, delete "ti"; and
Line 57, "is" should read --are--.

UNITED STATES PATENT AND TRADEMARK OFFICE
CERTIFICATE OF CORRECTION

PATENT NO. : 4,935,947

DATED : June 19, 1990

INVENTOR(S) : Mitsuaki Amemiya

Page 3 of 3

It is certified that error appears in the above-identified patent and that said Letters Patent is hereby corrected as shown below:

COLUMN 16

Line 4, "are" should read --are as follows:--;
Line 13, "(" should be deleted;
Line 14, "2)" should read --(2)--;
Line 15, "($\triangle$ 0.2" should read --($\triangle$=0.2--; and
Line 30, "have" should read --has--.

Signed and Sealed this

Sixteenth Day of June, 1992

*Attest:*

DOUGLAS B. COMER

*Attesting Officer*  *Acting Commissioner of Patents and Trademarks*